(12) United States Patent
Lee et al.

(10) Patent No.: US 7,053,005 B2
(45) Date of Patent: May 30, 2006

(54) METHOD OF FORMING A SILICON OXIDE LAYER IN A SEMICONDUCTOR MANUFACTURING PROCESS

(75) Inventors: Jung-Ho Lee, Suwon (KR); Dong-Jun Lee, Seoul (KR); Jung-Sik Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/779,733

(22) Filed: Feb. 18, 2004

(65) Prior Publication Data

US 2004/0224094 A1    Nov. 11, 2004

Related U.S. Application Data

(60) Continuation-in-part of application No. 10/278,992, filed on Oct. 24, 2002, which is a division of application No. 09/686,624, filed on Oct. 12, 2000, now Pat. No. 6,706,646.

(30) Foreign Application Priority Data

May 2, 2000    (KR) ............... 2000-23448
Feb. 18, 2003  (KR) ............ 10-2003-0010159

(51) Int. Cl.
*H01L 21/02* (2006.01)
(52) U.S. Cl. .............. 438/758; 438/694; 438/787; 427/314; 427/387
(58) Field of Classification Search ........... 438/694, 438/758, 787; 427/314, 387
See application file for complete search history.

(56) References Cited

U.S. PATENT DOCUMENTS

| | | | |
|---|---|---|---|
| 4,572,765 A | 2/1986 | Berry | |
| 4,937,304 A | 6/1990 | Ayama et al. | 528/34 |
| 4,950,381 A | 8/1990 | Takeuchi et al. | |
| 5,310,720 A | 5/1994 | Shin et al. | 437/231 |
| 5,405,790 A | 4/1995 | Rehim et al. | |
| 5,428,240 A | 6/1995 | Lur | |
| 5,436,398 A | 7/1995 | Shimizu et al. | 525/475 |

(Continued)

FOREIGN PATENT DOCUMENTS

EP    0 825 231    2/1998

(Continued)

OTHER PUBLICATIONS

Machine translation of JP 08-269399, Oct. 1996, Nakajima et al. (obtained from JPO website).

(Continued)

*Primary Examiner*—David Nelms
*Assistant Examiner*—Renee R. Berry
(74) *Attorney, Agent, or Firm*—Lee & Morse, P.C.

(57) ABSTRACT

A method of forming a silicon oxide layer in a semiconductor manufacturing process includes forming a planar spin on glass (SOG) layer by coating an SOG composition onto a semiconductor substrate having a stepped portion formed thereon, pre-baking the substrate at a temperature of from about 100 to about 500° C. for about 1 to about 10 minutes, maintaining a loading temperature of a furnace into which the substrate will be loaded at about 500° C. or less, loading the substrate into the furnace, and main-baking the substrate at a temperature of from about 500 to about 1200° C. for about 10 to about 120 minutes to form a silicon oxide layer on the substrate. The SOG layer is transformed into the silicon oxide layer through an optimized process condition. Thus, the silicon oxide layer may have minimal defects and a good layer property.

25 Claims, 8 Drawing Sheets

U.S. PATENT DOCUMENTS

| | | | |
|---|---|---|---|
| 5,494,978 A | 2/1996 | Shimizu et al. | 525/474 |
| 5,614,271 A | 3/1997 | Shibuya et al. | |
| 5,665,643 A | 9/1997 | Shin | |
| 5,738,911 A | 4/1998 | Imamura et al. | |
| 5,770,260 A | 6/1998 | Fukuyama et al. | |
| 5,822,658 A | 10/1998 | Tanaka et al. | |
| 5,839,029 A | 11/1998 | Kataoka et al. | |
| 5,885,654 A | 3/1999 | Hagiwara et al. | |
| 5,905,130 A | 5/1999 | Nakahara et al. | 528/14 |
| 5,907,382 A | 5/1999 | Kajiura et al. | |
| 5,922,411 A | 7/1999 | Shimizu et al. | |
| 5,974,666 A | 11/1999 | Tanaka et al. | |
| 5,976,618 A | 11/1999 | Fukuyama et al. | 427/226 |
| 5,989,945 A | 11/1999 | Yudasaka et al. | |
| 6,133,137 A | 10/2000 | Usami | |
| 6,187,662 B1 | 2/2001 | Usami et al. | |
| 6,190,788 B1 | 2/2001 | Shibuya et al. | |
| 6,215,144 B1 | 4/2001 | Saito et al. | |
| 6,235,620 B1 | 5/2001 | Saito et al. | |
| 6,261,883 B1 | 7/2001 | Koubuchi et al. | |
| 6,330,190 B1 | 12/2001 | Wang et al. | |
| 6,338,868 B1 | 1/2002 | Shibuya et al. | |
| 6,656,532 B1 | 12/2003 | Forester | |
| 6,706,646 B1 | 3/2004 | Lee et al. | |
| 6,762,126 B1 * | 7/2004 | Cho et al. | 438/694 |

FOREIGN PATENT DOCUMENTS

| | | |
|---|---|---|
| EP | 1 002 824 | 5/2000 |
| EP | 1 278 238 A1 | 1/2003 |
| JP | 11145286 | 5/1999 |
| JP | 2000-58646 | 2/2000 |
| KR | 1999-0068074 | 8/1999 |
| KR | 2000-0023448 | 4/2000 |
| KR | 2000-0059365 | 10/2000 |

OTHER PUBLICATIONS

Machine translation of JP 09-047722, Feb. 1997, Shibuya et al. (obtained from JPO website).

* cited by examiner

METHOD OF FORMING A SILICON OXIDE LAYER IN A SEMICONDUCTOR MANUFACTURING PROCESS

CROSS REFERENCE TO RELATED APPLICATIONS

This application is a Continuation-In-Part of U.S. patent application Ser. No. 10/278,992, entitled "SPIN-ON GLASS COMPOSITION AND METHOD OF FORMING SILICON OXIDE LAYER IN SEMICONDUCTOR MANUFCATURING PROCESS USING THE SAME," filed on Oct. 24, 2002, which is a divisional application of U.S. patent application Ser. No. 09/686,624, entitled "SPIN-ON GLASS COMPOSITION AND METHOD OF FORMING SILICON OXIDE LAYER IN SEMICONDUCTOR MANUFCATURING PROCESS USING THE SAME," filed on Oct. 12, 2000 now U.S. Pat. No. 6,706,646.

BACKGROUND OF THE INVENTION

1. Field of the Invention

The present invention relates to a method of forming a silicon oxide layer in a semiconductor manufacturing process. More particularly, the present invention relates to a method of forming a silicon oxide layer having a good property by applying a polysilazane-based spin on glass (SOG) composition and applying an appropriate condition in forming an insulation layer.

2. Description of the Related Art

Recently, rapid advances have been made in the design of semiconductor devices as information media such as computers are widely spread. In particular, this progress has required semiconductor devices to function with a high operating speed, and to have a large storage capacity. In order to meet such requirements, semiconductor devices with increased density, reliability, and response time are under development.

For manufacturing an integrated circuit, a large number of active devices are formed on a single substrate. First, after each device is insulated, some devices are electrically interconnected during the semiconductor manufacturing process to accomplish a desirable function of the circuits. MOS and bipolar VLSI and ULSI devices have multilevel interconnection structures in which a large number of devices are interconnected.

In such a multilevel interconnection structure, the topography of a top layer generally becomes more uneven as the number of layers increases. For example, a semiconductor wafer having two or more metal layers may be formed in the following manner. A number of oxide layers, a polycrystalline silicon conductive layer and a first metal wiring layer are formed on a semiconductor wafer and then an insulation layer is formed on the conductive layer and the first metal layer. Then, a via hole is formed for the integration of a second metal layer. Here, the surface of the insulation layer is uneven because layers underlying the insulation layer are uneven. When the second metal layer is directly formed on the insulation layer, the second metal layer is liable to make fractures owing to protrusions or recesses of the insulation layer. Such a deposition state of the second metal layer generates a decreased yield of the semiconductor device. Therefore, before the formation of the via hole or the second metal layer that will be formed in the multilevel metal interconnection structure, a planarization process of the insulation layer is required.

To planarize the insulation layer, various methods have been developed. For example, a method utilizing a borophosphor silicate glass (BPSG) layer, which has a good reflow characteristic, a method utilizing an SOG layer, or a method utilizing a chemical mechanical polishing (CMP) process may be used.

In general, BPSG is widely used as a material for forming an insulation layer to fill a gap between metal wirings. However, there are problems associated with BPSG deposition. One such problem is in establishing the proper apparatus and chamber state. Another problem is that the gases used in BPSG deposition are expensive and severely toxic to humans.

Furthermore, as the degree of integration increases and the design rule gradually decreases for manufacturing VLSI having 256 MDRAM or more, using BPSG as the insulation layer to fill the gaps between wirings lowers the yield of the device due to the generation of voids and bridges. In addition, an etch stop layer subsequently formed may be damaged during subsequent processes. In order to solve these problems, a reflowing and an expensive CMP process should be additionally performed.

To avoid the problems associated with BPSG, materials having a good gap filling property, such as tetra ethyl ortho silicate (TEOS), undoped silicate glass (USG) and high density plasma enhanced chemical vapor deposition (HDP-CVD) oxide, may be used instead. However, layers formed by using these materials also are liable to generate voids or seams when applied to a device having a design rule of which critical dimension (CD) is about 0.18 µm or less.

On the contrary, a planar insulation layer may be formed through a simple coating process using SOG. When coating, because the SOG is in a liquid or SOL state, the SOG has a good gap filling property and a good effect of reducing a step.

Among SOG materials, a silazane-based material has a chemical formula of $—(SiR_1R_2NR_3)_n—$ and has a mean molecular weight of from about 1,000 to about 10,000. Perhydropolysilazane is obtained when all of the parameters $R_1$, $R_2$ and $R_3$ are hydrogen, and an organic polysilazane is obtained when the parameters $R_1$, $R_2$ and $R_3$ are an alkyl, aryl or alkoxy functional group having 1–8 carbon atoms. One of these materials is included in an organic solvent such as dibutyl ether, toluene and xylene in a constant weight amount by % and then utilized for the coating process. The SOG coating material, called polysilazane in general, may be heat treated at a relatively higher temperature than silicate or siloxan-based materials. Accordingly, more complete curing is obtainable, and the coated material is highly resistant to wet etching, thereby facilitating subsequent processes. A polysilazane layer may be formed thick, and a planarization degree on the entire surface of a substrate can therefore be improved. As a result, it is not necessary to form a capping oxide layer on the polysilazane prior to a subsequent process such as a CMP process.

Various methods of preparing polysilazane are well known in the art. By one typical method, polysilazane is prepared by reacting halo-silane with a Lewis base to obtain a complex compound, and then reacting the complex compound with ammonia.

Also known is a method of preparing polysilazane by reacting a polyaminosilane compound with a polyhydrogenated nitrogen-containing compound under a base catalyst, or by reacting a polyhydrogenated silicon compound with a polyhydrogenated nitrogen-containing compound under a basic solid oxide catalyst.

Polysilazane may also be prepared by various other methods including reacting silicon halide such as $SiCl_4$ or $SiH_2Cl_2$ with amine, transforming silazane into polysilazane utilizing an alkaline metal halide catalyst, dehydrogenating from a silane compound utilizing a transition metal complex compound and an amine compound, and the like.

A defoamed polysilazane may be prepared by utilizing inorganic polysilazane of which a number average molecular weight is from about 100 to about 100,000. Another method includes preparing perhydropolysilazane of which a number average molecular weight is 1,120.

Various methods for forming a silicon oxide layer using polysilazane include forming a polysilazane layer, and then firing the polysilazane layer under an oxygen atmosphere to be transformed into the silicon oxide layer. Another method includes depositing an inorganic SOG, and then performing two-step heat treatment processes to transform the SOG layer into the silicon oxide layer.

The basic bone of polysilazane-based SOG is composed of Si—N, Si—H and N—H bonds. The Si—N bonds are substituted with Si—O bonds by baking under an atmosphere including oxygen and water. A simple spin coating process and a simple curing process are performed for the transformation of the SOG layer into the silicon oxide layer. Accordingly, it is an economic method. In addition, this method is advantageous in overcoming a step generated by a gap between underlying patterns.

However, it is known that all of the Si—N bonds are not substituted with Si—O bonds. Accordingly, insulating and electrical characteristics of a silicon oxide layer prepared from an SOG layer are different from those of a silicon oxide layer such as a BPSG layer or a TEOS layer. As a result, using an SOG layer as an insulating layer is avoided.

In addition, because the SOG is deposited by a spin coating method, the thickness of a silicon oxide layer formed therefrom is insufficient to completely cover underlying conductive layers such as a gate electrode and a metal wiring.

Therefore, the inventors of the instant application have developed an SOG composition that can be completely transformed into silicon oxide. After coating polysilazane, a solvent component is removed through a baking process. Then, a curing is implemented through a heat treatment at a high temperature of about 600° C. However, silane gas ($SiH_4$) starts to generate at about 400° C. from the coated layer and a large amount of the silane gas is exhausted during the heat treatment at the high temperature to combine with other exhausted components including nitrogen and a surrounding gas including oxygen. Accordingly, a large amount of particles having a size of about several hundreds of angstroms constituting a silicon nitride layer or a silicon oxide layer is formed on the surface portion of the substrate and on the inner portion of processing equipment. In addition, not only do the particles generate a particle defect on the corresponding substrate, but also on another substrate waiting to be processed in the same equipment.

SUMMARY OF THE INVENTION

In an effort to solve the aforementioned problems, it is a feature of an embodiment of the present invention to provide a method of forming a silicon oxide layer in a semiconductor manufacturing process by which the problems generated when applying an SOG composition during forming an insulation layer can be solved. In the method, a process for forming a silicon oxide layer using the SOG composition can be optimized and various defects can be prevented to improve a layer property.

An embodiment of the present invention provides a method of forming a silicon oxide layer in a semiconductor including forming a planar spin on glass (SOG) layer by coating an SOG composition onto a semiconductor substrate having a stepped portion formed thereon, pre-baking the substrate at a temperature of from about 100 to about 500° C. for about 1 to about 10 minutes, maintaining a loading temperature of a furnace into which the substrate will be loaded at about 500° C. or less, loading the substrate into the furnace, and main-baking the substrate at a temperature of from about 500 to about 1200° C. for about 10 to about 120 minutes to form a silicon oxide layer on the substrate.

The substrate may be pre-baked for about 4 to about 6 minutes at a temperature of from about 130 to about 230° C. The substrate may be pre-baked under an atmosphere of air, an oxygen gas, moisture, a mixture of oxygen and moisture, a nitrogen gas or in a vacuum.

The main-baking is preferably implemented for about 30 to about 60 minutes. The substrate is preferably main-baked under an atmosphere of air, an oxygen gas, moisture, a mixture of oxygen and moisture, a nitrogen gas or in vacuum.

The method may further include increasing the temperature in the furnace by about 7±3° C./min after loading the substrate into the furnace. The temperature of the furnace is preferably increased under an atmosphere of air, an oxygen gas, moisture, a mixture of oxygen and moisture, a nitrogen gas or in vacuum.

A thickness of the silicon oxide layer is preferably from about 4,000 to about 6,500 Å.

The stepped portion may be formed by at least two conductive patterns. A distance between the conductive patterns may be in a range of from about 0.04 about 1 µm. The two conductive patterns may be gate electrodes or metal wiring patterns of a semiconductor device.

An aspect ratio of the stepped portion may be in a range of from about 5:1 to about 10:1. However, the stepped portion may include a closely stepped portion of which an aspect ratio is from about 5:1 to about 10:1 and a global stepped portion of which an aspect ratio is no more than about 1:1.

The method may further include forming a silicon nitride layer having a thickness of from about 200 to about 600 Å before coating the spin-on glass composition.

Another embodiment of the present invention provides a method of forming a silicon oxide layer in a semiconductor manufacturing process, including forming a planar SOG layer onto a semiconductor substrate having a stepped portion formed thereon by coating an SOG composition comprising from about 20 to about 30% by weight of perhydropolysilazane having a structure of —(SiH2NH)n- (in which n represents a positive integer), having a weight average molecular weight of from about 4,000 to about 8,000, and having a molecular weight dispersion degree of from about 3.0 to about 4.0, and from about 80 to about 70% by weight of a solvent, pre-baking the substrate at a temperature of from about 130 to about 230° C. for about 4 to about 6 minutes, maintaining a loading temperature of a furnace into which the substrate will be loaded at about 500° C. or less, loading the substrate into the furnace and increasing the temperature of the furnace by about 7±3° C./min, and main-baking the substrate at a temperature of from about 500 to about 1200° C. for about 30 to 60 minutes to form a silicon oxide layer on the substrate.

The method may further include implementing an edge bead removal after forming the SOG layer, and implementing a CMP process after forming the silicon oxide layer. Preferably, an aspect ratio of the stepped portion is in a range of from about 5:1 to about 10:1.

The spin-on glass composition may be a polysilazane-based spin-on glass composition.

The polysilazane-based spin-on glass composition preferably includes from about 20 to about 30% by weight of perhydropolysilazane having a structure of —(SiH2NH)n- (in which n represents a positive integer), having an average molecular weight of from about 4,000 to about 8,000, and having a molecular weight dispersion degree of from about 3.0 to about 4.0, and from about 80 to about 70% by weight of a solvent.

In this case, the spin-on glass composition preferably has a uniform viscosity of from about 1 to about 10 mPs·s at a shear rate of from about 54 to about 420 (1/s). The spin-on glass composition preferably has a contact angle of no more than about 4° with respect to an underlying layer on which the spin-on glass composition is to be coated. The spin-on glass composition preferably includes at least one compound including an element selected from the group consisting of boron, fluorine, phosphorous, arsenic, carbon and oxygen as an impurity material. The solvent is preferably xylene or dibutyl ether.

The method my further include implementing an edge bead removal after forming the SOG layer. Further, the method my include implementing a chemical mechanical polishing (CMP) process after forming the silicon oxide layer.

As described above, an SOG composition, particularly a polysilazane-based material, is applied and then heat treated to optimize a process of forming a silicon oxide layer to produce an oxide layer having a good layer property and significantly reduced defects.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1A:
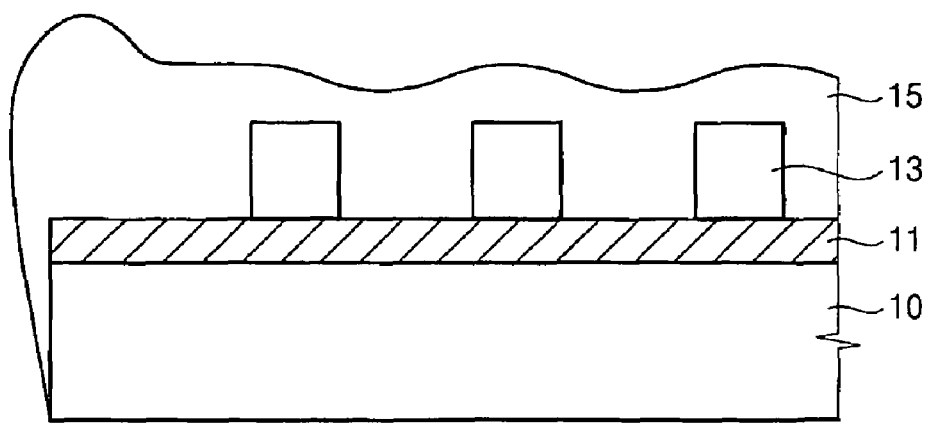
FIGS. 1A and 1B illustrate cross-sectional views for explaining a method of removing an edge bead of an SOG layer applied according to one embodiment of the present invention.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

First, an SOG composition is coated on a semiconductor substrate having a stepped portion formed at an upper portion thereof to form a planar SOG layer. A polysilazane-based composition having a good gap filling property and a good planarization property of the formed layer is preferred as the SOG composition.

The liquid state SOG composition is applied by a spin coating method while rotating a wafer, or substrate, at a rapid velocity to form a planar layer on the substrate utilizing centrifugal force. Here, since the SOG composition of the liquid state is applied onto the substrate, which is rotated, abnormal thickening of the SOG layer at an edge portion of the substrate may be generated due to a bead (a ring-shaped ornament) formation at the same edge portion.

Generally, a CMP process is implemented by polishing a layer with a polishing pad that is larger than the wafer. However, when a layer is formed by applying a liquid state material on a wafer, the layer becomes thick at the edge portion of the wafer. As a result, excess polishing may occur at edge dies of the wafer because of the structure of the CMP polishing pad. Various kinds of particles are separated at the edge portion of the wafer, generating various kinds of defects in the wafer, some of which may become fatal defects when implementing subsequent processes. In particular, a planarization degree at the polished portion after completing the CMP process affects a pattern or pattern density of a semiconductor device. Various kinds of materials including particles generated during the CMP process can generate a U-scratch or a defect on a remaining layer.

In order to solve the above-described problems, an edge bead removing method is applied for removing the thick portion of the layer formed at the edge portion of the substrate. This method will now be described in detail referring to accompanying drawings.

Figure 1B:
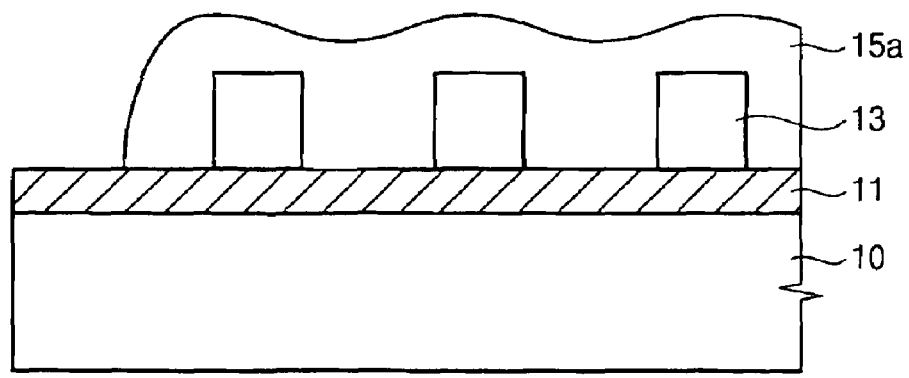

FIGS. 1A and 1B illustrate cross-sectional views for explaining a method of removing an edge bead of an SOG layer that is applied in accordance with an embodiment of the present invention.

Referring to FIG. 1A, an insulation layer 11 is formed on a semiconductor substrate 10 having various devices formed thereon. On the insulation layer 11, a plurality of metal wirings 13 is formed, and then an SOG layer 15 is formed to fill the gaps between the metal wirings 13. Here, the SOG layer 15 is formed by spraying an SOG solution onto the substrate 10 while rotating the substrate 10.

Next, an edge bead removing (EBR) process is implemented to remove excessive SOG at the edge portion of the substrate by spraying an SOG removing solution through a nozzle to dissolve the SOG. Generally, the SOG is dissolved into an aromatic solvent including xylene, ether including dibutyl ether, and the like. Accordingly, one of these solvents is used as the SOG removing solution. In this case, the SOG removing solution is sprayed on an upper portion of the substrate 10, from the outer edge inward about 3–5 mm.

Referring to FIG. 1B, an SOG layer 15a is formed as a result of removing the SOG layer formed at the edge portion of the substrate 10 by the EBR process.

As described above, when an EBR process is performed after forming the SOG layer, generation of a U-scratch or a defect due to particles generated at the edge of the substrate during a subsequent CMP process can be prevented. Therefore, when an SOG composition is coated and then cured to form a silicon oxide layer and a subsequent CMP process is applied, an EBR process is preferably performed on the silicon oxide layer.

Figure 2:
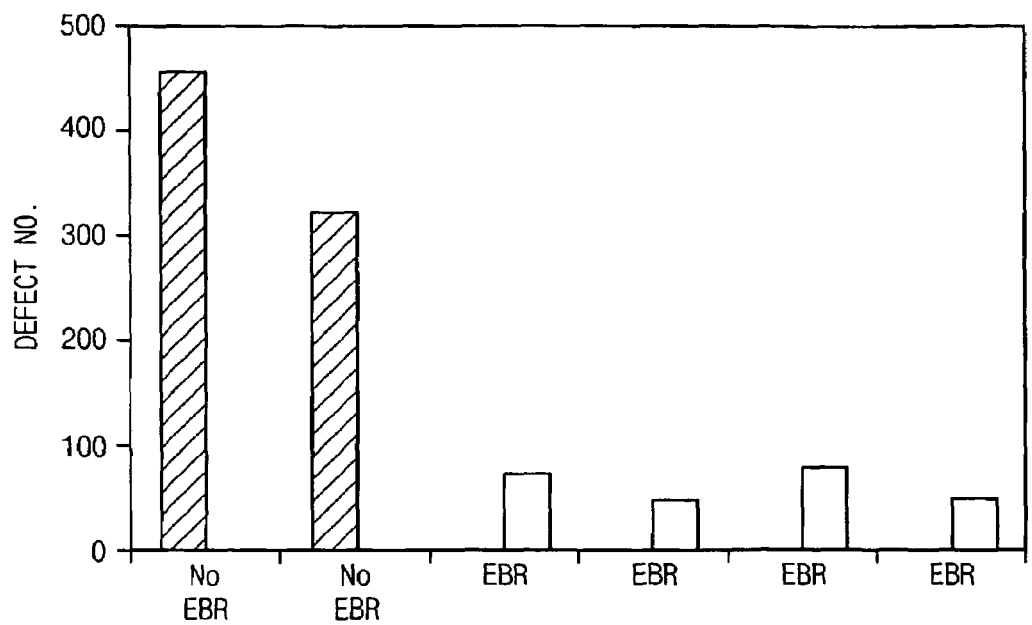
FIG. 2 is a graph illustrating numbers of defects generated when applying and not applying a method of removing an edge bead after coating an SOG composition.

FIG. 2 is a graph illustrating numbers of defects generated when applying and when not applying a method of removing an edge bead after coating an SOG composition. In the graph of FIG. 2, bars labeled "no EBR" correspond to a conventional method in which the EBR process is not applied, and bars labeled "EBR" correspond to a method of the present invention in which the EBR process is applied.

FIG. 2 illustrates that the number of defects observed when the EBR process is applied is reduced to about 100 or less from about 300 to about 500 defects observed when the EBR process is not applied.

After completing the coating of the SOG composition and the EBR process, a pre-baking process is performed. In order to determine the temperature of the pre-baking, the viscosity behavior of a neat polymer was observed.

Figure 3:
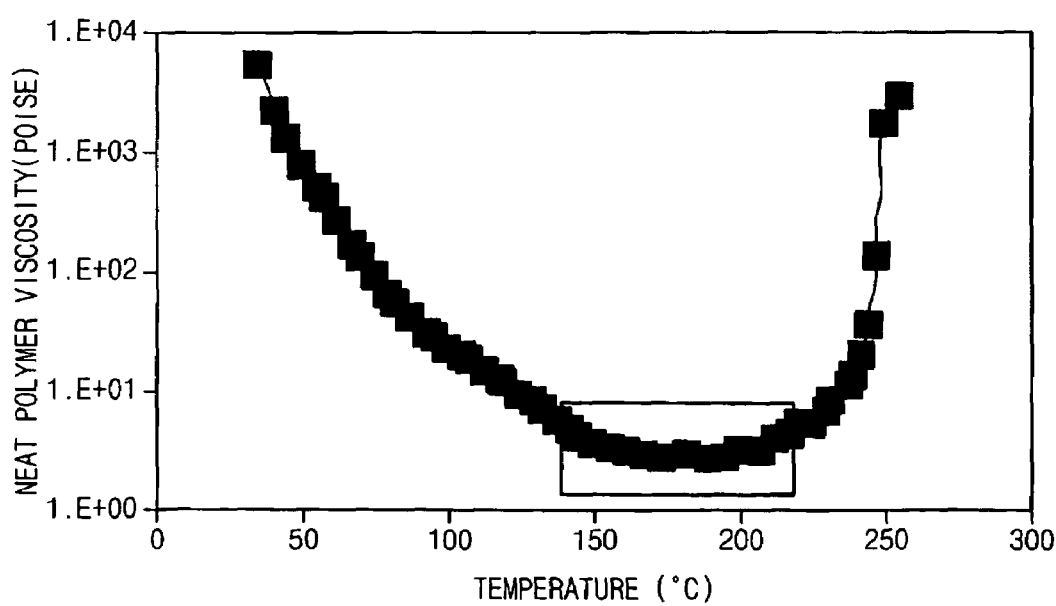
FIG. 3 is a graph illustrating a viscosity behavior of polysilazane neat polymer for determining a pre-baking temperature of an SOG composition.

FIG. 3 is a graph illustrating viscosity behavior of polysilazane neat polymer for determining a pre-baking temperature of an SOG composition.

In order to maintain flowability of the polymer, pre-baking at a temperature at which the viscosity of the polymer is as low as possible is preferable. The graph of FIG. 3 shows variation in viscosity when pre-baking was performed at a temperature range of from about 100° C. to about 500° C. for about 1 to about 10 minutes. When the temperature of the pre-baking was below about 100° C., the solvent contained in the SOG composition was not completely removed, whereas when the temperature was higher than about 500° C., the flowability of the polymer was deteriorated, resulting in lower coating uniformity.

In addition, when the time period for the pre-baking was shorter than about 1 minute, the solvent contained in the composition was not evaporated or a layer having an inappropriate state for a subsequent process was obtained. When the time period of the pre-baking was longer than about 10 minutes, surface curing was excessively progressed, even more so than was expected. Therefore, the pre-baking is preferably performed for about 1 to 10 minutes, and more preferably for about 4 to about 6 minutes at a temperature of from about 130 to about 230° C., so that the polymer has a viscosity range illustrated by a box in FIG. 3.

It is also preferable for the pre-baking to be carried out under an atmosphere of air, oxygen gas, moisture, a mixture of oxygen and moisture, nitrogen gas or in a vacuum.

After completing the pre-baking process, a main-baking process, which is important in determining a layer property, is implemented. The coated SOG layer is transformed into silicon oxide through the main-baking process, and thereby becomes a very dense layer having little defect. The main-baking process includes three steps, which are described below.

First, a temperature within a furnace into which a wafer or substrate will be loaded is maintained at a temperature of about 500° C. or less. When the loading temperature of the furnace is higher than about 500° C., a crack, lifting, defect, etc. may be generated at a surface portion of the wafer. Accordingly, the loading temperature of the furnace is preferably controlled not to exceed 500° C. Since the pre-baking is performed at a temperature of about 100° C. or more, preferably at a temperature of from about 130 to about 230° C., i.e., at about 200° C., the inner portion of the furnace is initially maintained at a temperature of from about 100 to about 200° C. In order to obtain a layer having a good property, the loading temperature may be lowered without limitation to 100° C. or less. However, if the loading temperature of the furnace is too low, efficiency of production may be significantly reduced. When considering the previously implemented pre-baking process, the preferred loading temperature is in a range of from about 200 to about 500° C.

After loading the wafer or substrate into the furnace, the temperature of the furnace is increased. Here, the increasing rate of the temperature is preferably maintained at about 7±3° C./min. When the temperature is increased at a rate less than about 7±3° C./min., efficiency of production is reduced. However, when the temperature is increased at a rate greater than about 7±3° C./min., curing may occur only at the surface portion of the wafer. Therefore, the temperature is preferably increased at a rate of about 7±3° C./min.

In order to obtain a layer having a good property, the preferred atmosphere of the furnace during the temperature increase is air, oxygen gas, moisture, a mixture of oxygen and moisture, nitrogen, or in vacuum. The most preferred atmosphere is an oxygen gas.

Finally, a main-baking process is performed at a temperature range of from about 500 to about 1200° C. for about 10 to about 120 minutes to transform the SOG into silica. When the temperature of the main-baking is lower than about 500° C., a sufficient surface curing or a complete transformation into silica may not be accomplished. When the temperature of the main-baking is higher than about 1200° C., an adverse effect onto a previously formed device may be generated. Therefore, the given temperature range of from about 500 to about 1200° C. is preferred. Similarly, when the time period of the main-baking is shorter than about 10 minutes, a sufficient transformation into silica is not accomplished, and when the time period of the main-baking is longer than about 120 minutes, a layer having an inappropriate property may be formed. Accordingly, the given time period of about 10 to about 120 minutes is preferred.

More preferably, the main-baking process is implemented at a temperature range of from about 700 to about 1,000° C. for about 30 to about 60 minutes. A preferred atmosphere of the main-baking process is air, oxygen gas, moisture, a mixture of oxygen and moisture, nitrogen gas or in vacuum. The mixture of oxygen and moisture is most preferred for the atmosphere during the main baking process.

An appropriate SOG composition applicable in the method of the present invention is a polysilazane-based SOG composition. More preferably, the composition includes perhydropolysilazane having a structure of —$(SiH_2NH)_n$— in which n represents a positive integer. The perhydropolysilazane preferably has an average molecular weight of from about 4,000 to about 8,000 and a molecular weight dispersion degree of from about 3.0 to about 4.0.

A method of preparing polysilazane used in the present invention is not limited to a certain method and all kinds of perhydropolysilazane prepared by known methods may be used in the present invention.

An SOG solution is prepared by dissolving the aforementioned perhydropolysilazane in an organic solvent. Various organic solvents are applicable in the present invention without limitation; however, preferred solvents are an aromatic solvent such as xylene and an ether solvent such as dibutyl ether. The amount of perhydropolysilazane in the SOG solution is in a range of from about 20 to about 30% by weight of the SOG solution, and is preferably in a range of from about 22 to about 25% by weight of the SOG solution.

A contact angle of the SOG solution including perhydropolysilazane with an underlying layer such as a silicon nitride layer is preferably no more than about 4°. If the contact angle of the SOG solution with the underlying layer exceeds 4°, adhesion between the SOG layer and the underlying layer is poor.

The SOG solution preferably has a uniform viscosity of from about 1 to about 10 mPs·s and more preferably of about 1 to about 8 mPs·s at a predetermined shear rate. The SOG composition has a constant viscosity of about 1–10 mPs·s at a shear rate of 54–420 (1/s).

The SOG solution may include at least one compound including one element such as boron, fluorine, phosphor, arsenic, carbon and oxygen as an impurity material, depending on a desired application. When boron, fluorine, phosphor or arsenic is included among the impurity materials in the SOG solution, a silicon oxide layer formed from the SOG solution will include the impurity material, thereby obtaining characteristics similar to those of a conventional BSG layer, BPSG layer, PSG layer, and the like. Inclusion of either carbon or oxygen in the SOG solution as an impurity may promote conversion of the SOG layer into the silicon oxide layer.

The SOG solution is coated onto a semiconductor substrate having a stepped portion thereon by a spin coating method, thereby forming a planar SOG layer.

The stepped portion may be formed by at least two conductive patterns, for example, conductive metal wiring patterns such as gate electrode patterns or bit lines. A distance between the two conductive patterns is unlimited. In general, however, when a distance between the two conductive patterns is wider than about 1 μm, the conventional method of forming an oxide layer by utilizing BPSG is appropriate. However, when the distance between the two conductive patterns is shorter than about 0.04 μm, the method utilizing the SOG solution is generally not appropriate because of the possibility of void formation although the SOG solution has good step coverage. Accordingly, the method of the present invention is preferably applied to a semiconductor substrate on which conductive patterns having a gap of from about 0.04 to about 1 μm are formed. Here, the method of the present invention may be applied to a conductive pattern having a low aspect ratio (wherein the aspect ratio represents a ratio of a depth to a width of a gap). However, a conductive pattern having an aspect ratio of from about 5:1 to about 10:1 is preferably applied.

Generally, a closely stepped portion in which conductive patterns are closely formed such as a cell array region including gate electrodes and a global stepped portion in which the conductive patterns are sparsely formed such as a peripheral circuit region are formed on a semiconductor substrate. The present invention may be applied to a semiconductor substrate having a closely stepped portion of which an aspect ratio is from about 5:1 to about 10:1 and a global stepped portion of which an aspect ratio is about 1:1 or less.

In addition, the stepped portion may be formed from a prominence/recess portion of the semiconductor substrate. In particular, on a stepped portion of the semiconductor substrate having grooves and protrusions for manufacturing an isolation structure having a shallow trench isolation (STI) structure, an oxide layer may be formed by the method of the present invention to form an isolation layer of an STI structure.

The stepped portion may be formed by metal wirings formed on an insulation layer. That is, a silicon oxide layer formed by the method of the present invention may be utilized as an insulation interlayer for insulating metal wirings formed on the insulation layer.

One coating of the SOG composition based on the present invention gives a silicon oxide layer with a thickness of from about 4,000 to about 6,500 Å. Before coating the SOG composition, a silicon nitride layer with a thickness of from about 200 to about 600 Å may be formed as an etch stop layer on upper and side portions of the conductive patterns.

Hereinafter, an embodiment of a method of forming a silicon oxide layer in a semiconductor process according to the present invention will be described in detail in with reference to the accompanying drawings.

FIGS. 4A to 4K illustrate cross-sectional views for explaining a method of forming a silicon oxide layer according to a preferred embodiment of the present invention.

Figure 4A:
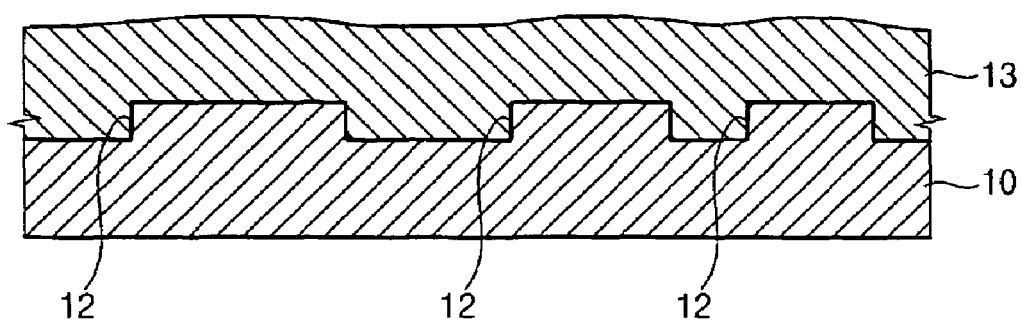
FIGS. 4A to 4K illustrate cross-sectional views for explaining a method of forming a silicon oxide layer according to one embodiment of the present invention.

Referring to FIG. 4A, a p-type substrate 10 formed using a semiconductor material such as silicon (Si) is prepared. A trench 12 is formed on the substrate 10 by etching an isolation region. The depth of the trench 12 is about 4,600 Å and the width thereof is about 1,250 Å.

Commercially available perhydropolysilazane is purchased and perhydropolysilazane having an average molecular weight of from about 4,500 to about 7,000 and a molecular weight dispersion degree of from about 3.0 to about 4.0 is prepared by a fractionation method. A spin-on-glass composition is prepared by dissolving the thus prepared perhydropolysilazane having a molecular dispersion degree of from about 3.0 to about 4.0 into xylene in a concentration of about 22 to about 25% by weight of a resultant SOG solution.

On the substrate 10 on which the trench 12 is formed, the prepared SOG solution is coated to a thickness of about 6,000 to about 7,000 Å to form a first SOG layer 13. Then an EBR process is applied. Xylene is sprayed toward an edge portion of the substrate at a point that is about 3 to about 5 mm inward of the edge of the substrate to remove beads formed at the edge portion of the substrate.

Figure 4B:
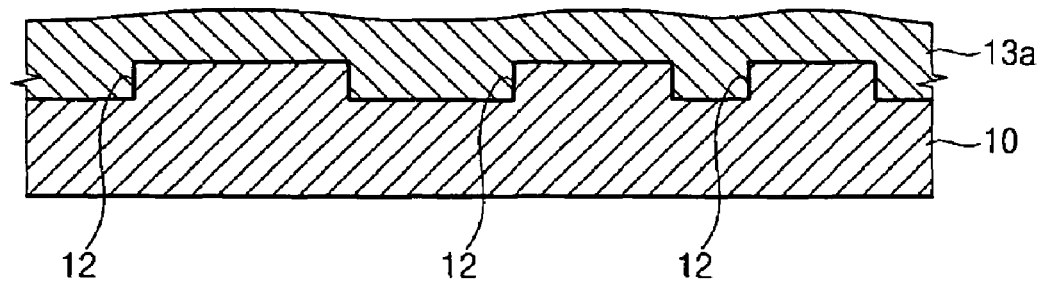

Referring to FIG. 4B, the first SOG layer 13 is pre-baked at about 170° C. for about 4 minutes under an atmosphere of nitrogen. Then, the temperature of a furnace is maintained at a temperature of about 400° C. and the wafer is loaded into the furnace. Next, the temperature within the furnace is increased by a rate of about 7° C./min. Here, an oxygen atmosphere is maintained in the furnace. The temperature is increased to about 800° C. and a main-baking process is performed for about 50 minutes to transform the SOG layer 13 into a first silicon oxide layer 13a. Here, a moisture atmosphere including about 86% by weight of water is maintained in the furnace.

Figure 4C:
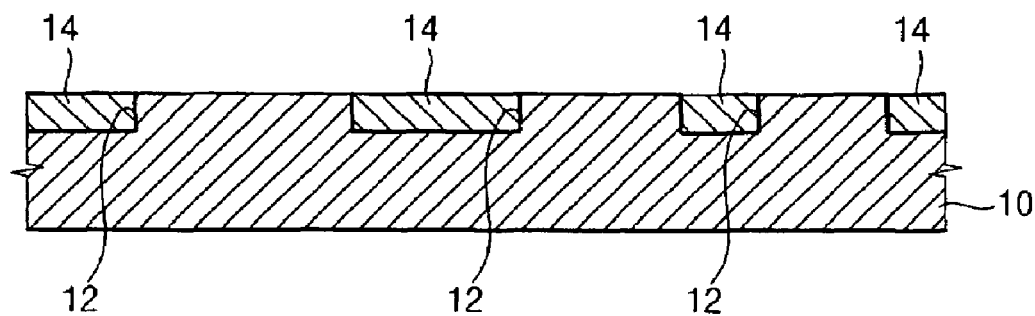

Referring to FIG. 4C, the thus obtained first silicon oxide layer 13a is polished by a CMP process until the upper surface of the semiconductor substrate 10 is exposed to form a device isolation region where the inside portion of the trench 12 is filled with silicon oxide 14.

Figure 4D:
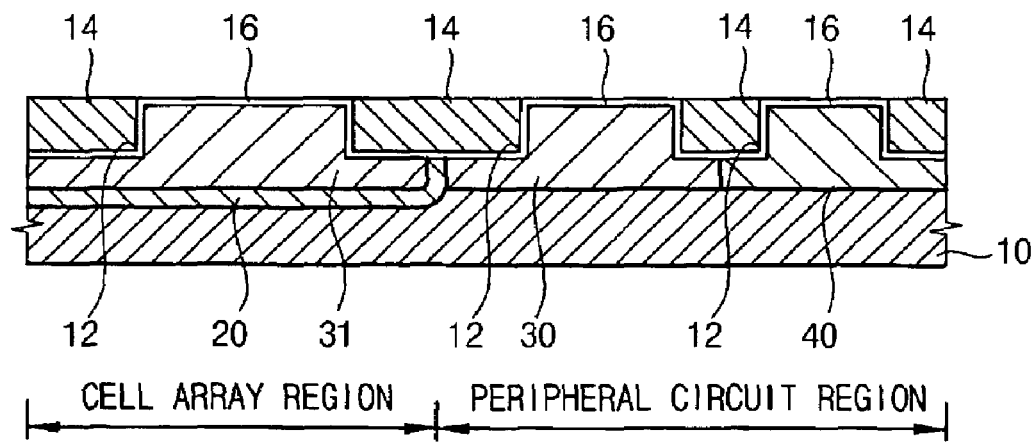

Referring to FIG. 4D, an n-type semiconductor region 20 is formed by doping an n-type impurity such as phosphorous (P) into a region for forming memory cells of the semiconductor substrate 10 (a cell array region), p-type wells 31, 30 are respectively formed by doping a p-type impurity such as boron (B) into the cell array region and a portion of a peripheral circuit regions and an n-type well 40 is formed by doping an n-type impurity such as phosphorous (P) into a remaining portion of the peripheral circuit region.

Next, an impurity for controlling a threshold voltage such as boron fluoride ($BF_2$) is doped into the p-type wells 31 and 30 and the n-type well 40. Thereafter, each surface portion of the p-type well 30 and the n-type well 40 is cleansed by utilizing a fluorine-based cleansing solution, and the semiconductor substrate 10 is wet oxidized to form a gate oxide layer 16 on each surface of the p-type wells 30 and 31 and the n-type well 40. In this case, a portion of the substrate within the trench 12 is also partially oxidized to form a continuous gate oxide layer 16. A thickness of the gate oxide layer 16 is from about 40 to about 200 Å.

Figure 4E:
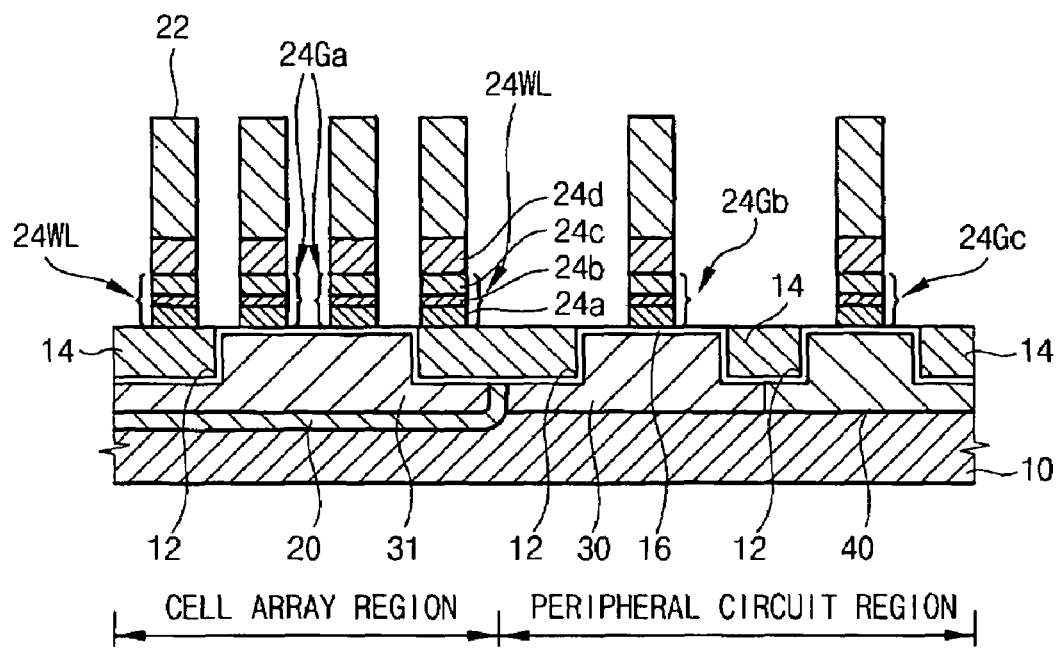

Referring to FIG. 4E, on the substrate 10, in which silicon oxide 14 fills the trench 12 as a field oxide, and on which the gate oxide layer 16 is formed, a polysilicon layer (not shown) having a thickness of from about 500 to about 4,000 Å is formed by depositing polycrystalline silicon doped with an n-type impurity such as phosphorous (P) by an LPCVD process. Then, tungsten silicide and tungsten are subsequently deposited on the polysilicon layer by a sputtering process to form a tungsten silicide layer and a tungsten layer (not shown). The tungsten silicide layer and the tungsten layer each have a thickness of from about 1,000 to about 2,000 Å. A silicon nitride layer (not shown) is deposited on the tungsten layer. The silicon nitride layer is formed by a low pressure chemical vapor deposition (LPCVD) process or a plasma enhanced chemical vapor deposition (PECVD) process to have a thickness of from about 500 to about 2,000 Å.

On the silicon nitride layer, a photoresist film (not shown) is formed and selectively exposed by utilizing a mask. Then, the photoresist film is developed to form a photoresist pattern 22 for forming a gate electrode. The silicon nitride layer, tungsten layer, tungsten nitride layer and polysilicon layer are etched one by one using the photoresist pattern 22 as an etching mask to form gate electrodes 24Ga, 24Gb and 24Gc and word lines 24WL composed of a polysilicon pattern 24a, a tungsten suicide pattern 24b, a tungsten pattern 24c and a silicon nitride pattern 24d.

Figure 4F:
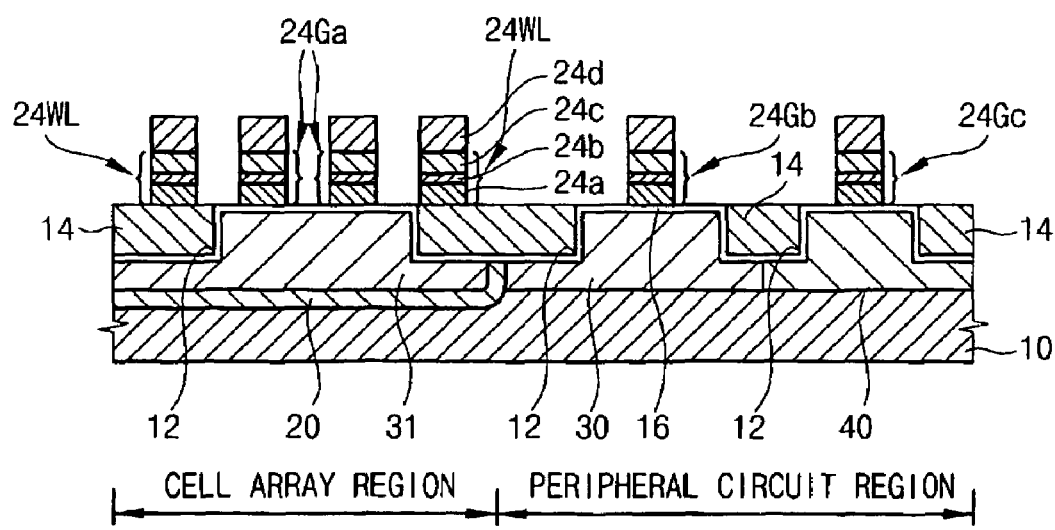

Referring to FIG. 4F, the photoresist pattern 22 is removed thereby forming the gate electrodes 24Ga and the word lines 24WL in the cell array region and the gate electrodes 24Gb and 24Gc in the peripheral circuit region.

The gate electrodes 24Ga and word lines 24WL formed in the cell array region are manufactured so that gaps therebetween are from about 0.04 to about 1 μm wide. An aspect ratio, or ratio of depth to width, of the gaps between the gate electrodes 24Ga and word lines 24WL is in a range of from about 5:1 to about 10:1 to form a closely stepped portion. On the contrary, an aspect ratio of gaps between the gate electrodes 24Gb and 24Gc formed in the peripheral circuit region is less than about 1:1 to form a global stepped portion.

Figure 4G:
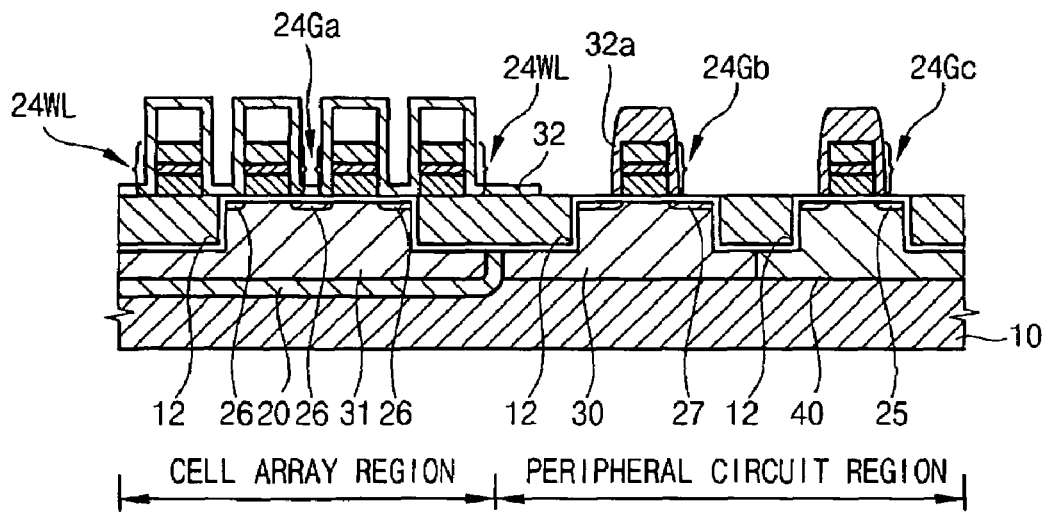

Referring to FIG. 4G, a p-type impurity doped region 25 is formed in the n-type well 40 at both sides of the gate electrode 24Gc by doping a p-type impurity such as boron into the n-type well 40. Also, an n-type impurity doped region 27 is formed in the p-type well 30 at both sides of the gate electrode 24Gb by doping an n-type impurity such as phosphorous into the p-type well 30. In addition, an n-type impurity doped region 26 is formed in the p-type well 31 at both sides of the gate electrodes 24Ga by doping an n-type impurity such as phosphorous into the p-type well 31 in the cell array region.

Then, silicon nitride is deposited on the semiconductor substrate 10 by a chemical vapor deposition method to form a silicon nitride layer (not shown) having a thickness of from about 200 to about 600 Å. Next, the silicon nitride layer on the cell array region is covered with a photoresist film (not shown) and the silicon nitride layer on the peripheral circuit region is anisotropically etched to form a spacer 32a on side walls of the gate electrodes 24Gb and 24Gc of the peripheral circuit region. The photoresist film is removed leaving exposed silicon nitride layer 32 on the cell array region. Next, p+-type impurity doped regions (source, drain regions) are formed by doping a p-type impurity such as boron into the p-type impurity doped region 25 in the n-type well 40 of the peripheral circuit region. In addition, n+-type impurity doped regions (source, drain regions) are formed by doping an n-type impurity such as arsenic (As) into the n-type impurity doped region 27 in the p-type well 30 of the peripheral circuit region.

Figure 4H:
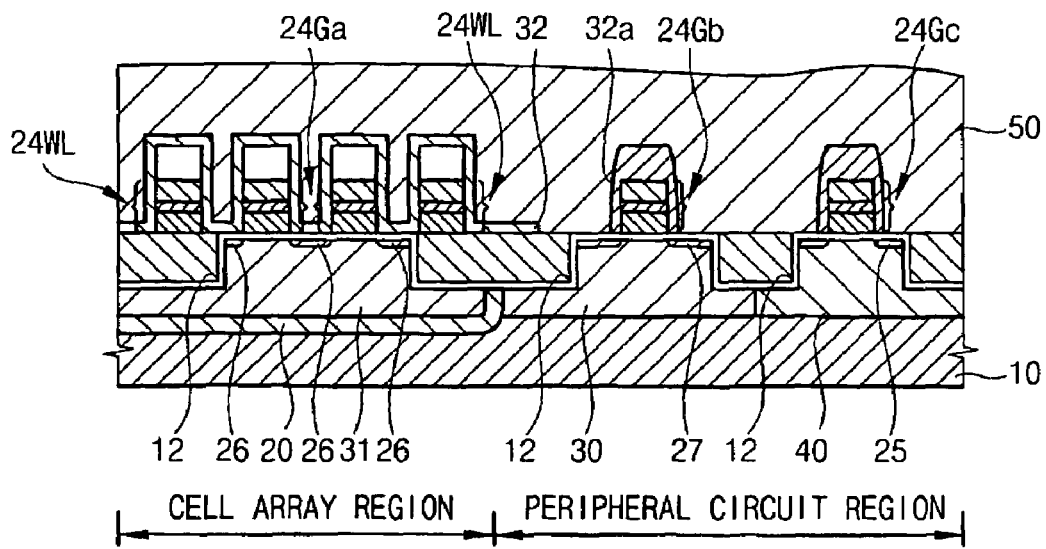

Referring to FIG. 4H, an SOG solution is coated on the semiconductor substrate 10 to form a second SOG layer 50. The second SOG layer 50 is formed by a spin coating process in which a rotational velocity of the substrate 10 is from about 500 to about 2,500 rpm. The thickness of the second SOG layer 50 is in a range of from about 7,500 to about 8,200 Å. The second SOG layer 50 completely covers the gate electrodes 24Ga, 24Gb and 24Gc and the word lines 24WL.

Next, the second SOG layer 50 is pre-baked at about 170° C. for about 4 minutes under a nitrogen gas atmosphere. Meanwhile, a temperature of a furnace is maintained at about 400° C. and the substrate having the pre-baked second SOG layer 50 formed thereon is loaded into the furnace. Then, the temperature of the furnace is increased at a rate of about 7° C./min. Here, an oxygen atmosphere is maintained in the furnace. The temperature of the furnace is increased to about 800° C. and at this temperature a main-baking process is performed for about 50 minutes to cure the second SOG layer 50. During the main-baking process, a moisture atmosphere including about 86% by weight of water is maintained in the furnace.

Figure 4I:
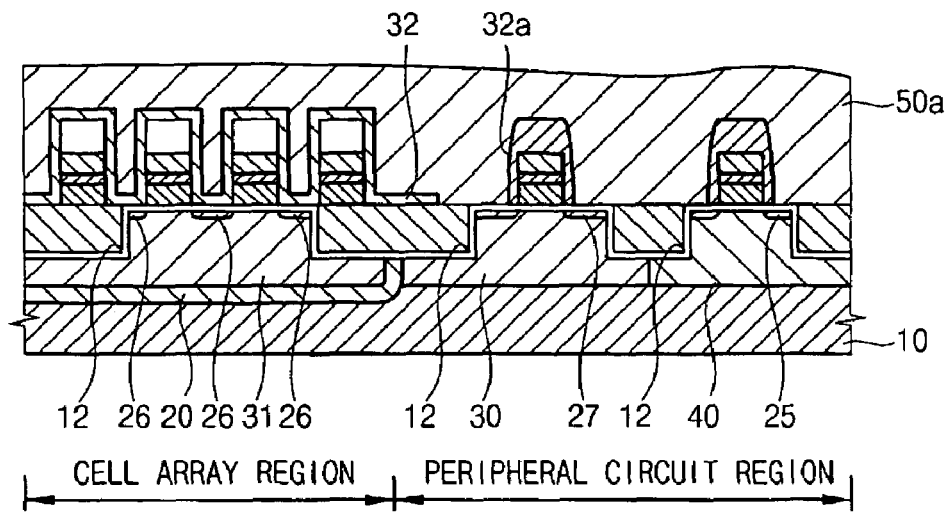

Through the above-described curing process, Si—N bonds in the second SOG layer 50 are substituted with Si—O bonds to transform the second SOG layer 50 into a silicon oxide layer. The silicon oxide layer is contracted by about 19 to 20% of the thickness of the second SOG layer 50, to form a second silicon oxide layer 50a, as shown in FIG. 4I.

Figure 4J:
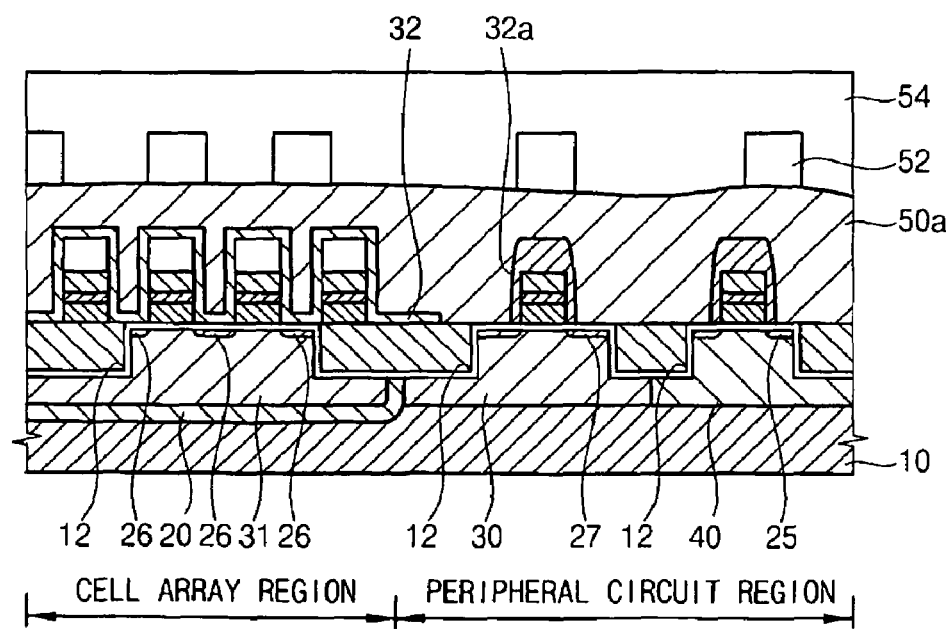

Referring to FIG. 4J, a metal layer (not shown) having a thickness of about 5,000 Å is formed by depositing a metal such as aluminum, tungsten, etc., on the second silicon oxide layer 50a by a common sputtering process. Metal patterns 52, each having a width of about 6,600 Å and a height of about 8,400 Å, are formed by patterning the metal layer by a photolithography process.

Next, a third SOG layer 54 having a thickness within a range of from about 3,800 to about 4,500 Å and completely covering the metal patterns 52 is formed by spin coating the SOG solution.

Figure 4K:
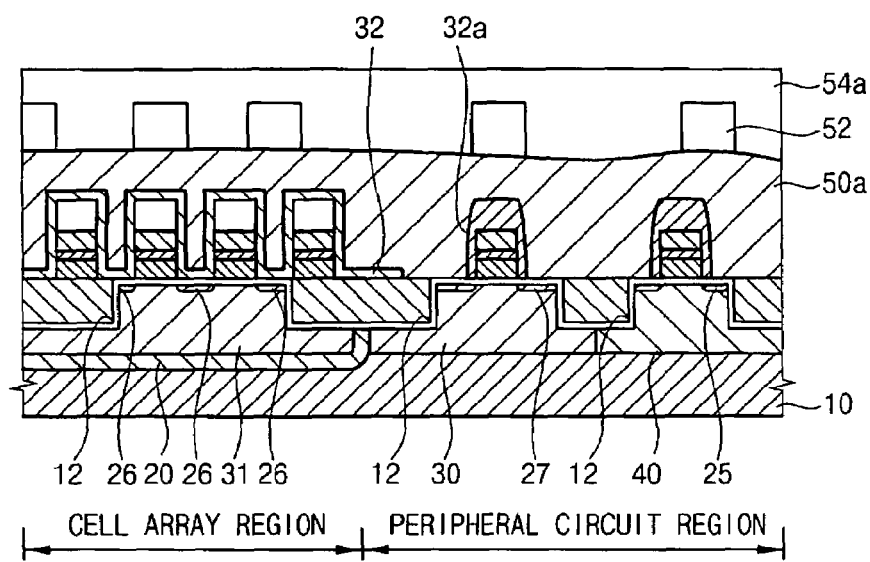

Referring to FIG. 4K, the third SOG layer 54 is pre-baked at about 170° C. under a nitrogen gas atmosphere. The temperature of the furnace is maintained at about 400° C., and the substrate having the pre-baked third SOG layer 54 formed thereon is loaded into the furnace. The temperature of the furnace is increased at a rate of about 7° C./min. In this case, an oxygen atmosphere is maintained in the furnace. The temperature of the furnace is increased to about 800° C. and a main-baking process is performed for about 50 minutes at this temperature. The main-baking process is performed under a moisture atmosphere including about 86% by weight of water to cure the third SOG layer 54. Then, Si—N bonds in the third SOG layer 54 are substituted with Si—O bonds through the curing and the third SOG layer 54 is transformed into a third silicon oxide layer 54a having a planar surface.

A semiconductor device may then be manufactured by performing a common semiconductor device manufacturing process.

According to the above-described method of forming a semiconductor device according to the present invention, a silicon oxide layer having a good layer property may be manufactured by applying an SOG layer as an insulation layer under an optimized process condition.

As described above, a silicon oxide layer having minimized defect generation and a good layer property may be formed by applying the SOG composition of the present invention and transforming a thus formed SOG layer into a silicon oxide layer by applying an optimized process condition.

In particular, a main-baking process for curing an SOG layer formed by applying the SOG composition of the present invention is carried out in several separate steps to optimize a heat treatment process condition. The SOG component is completely transformed into a silica component to provide a layer having a dense structure and virtually no defects.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a silicon oxide layer in a semiconductor manufacturing process, comprising:
   forming a planar spin on glass (SOG) layer by coating an SOG composition onto a semiconductor substrate having a stepped portion formed thereon;
   pre-baking the substrate at a temperature of from about 100 to about 500° C. for about 1 to about 10 minutes;
   maintaining a loading temperature of a furnace into which the substrate will be loaded at about 500° C. or less;
   loading the substrate into the furnace; and
   main-baking the substrate at a temperature of from about 500 to about 1200° C. for about 10 to about 120 minutes to form a silicon oxide layer on the substrate.

2. The method as claimed in claim 1, further comprising implementing an edge bead removal after forming the SOG layer.

3. The method as claimed in claim 2, further comprising implementing a chemical mechanical polishing (CMP) process after forming the silicon oxide layer.

4. The method as claimed in claim 1, wherein the substrate is pre-baked for about 4 to about 6 minutes at a temperature of from about 130 to about 230° C.

5. The method as claimed in claim 1, wherein the substrate is pre-baked under an atmosphere of air, an oxygen gas, moisture, a mixture of oxygen and moisture, a nitrogen gas or in a vacuum.

6. The method as claimed in claim 1, wherein the main-baking is implemented for about 30 to about 60 minutes.

7. The method as claimed in claim 1, wherein the substrate is main-baked under an atmosphere of air, an oxygen gas, moisture, a mixture of oxygen and moisture, a nitrogen gas or in a vacuum.

8. The method as claimed in claim 1, further comprising increasing a temperature in the furnace by about 7±3° C./min after loading the substrate into the furnace.

9. The method as claimed in claim 8, wherein the temperature of the furnace is increased under an atmosphere of air, an oxygen gas, moisture, a mixture of oxygen and moisture, a nitrogen gas or in a vacuum.

10. The method as claimed in claim 1, wherein the spin-on glass composition is a polysilazane-based spin-on glass composition.

11. The method as claimed in claim 10, wherein the spin-on glass composition comprises:
   from about 20 to about 30% by weight of perhydropolysilazane having a structure of —(SiH$_2$NH)$_n$— (in which n represents a positive integer), having an average molecular weight of from about 4,000 to about 8,000, and having a molecular weight dispersion degree of from about 3.0 to about 4.0; and
   from about 80 to about 70% by weight of a solvent.

12. The method as claimed in claim 11, wherein the spin-on glass composition has a uniform viscosity of from about 1 to about 10 mPs·s at a shear rate of from about 54 to about 420 (1/s).

13. The method as claimed in claim 11, wherein the spin-on glass composition has a contact angle of no more than about 4° with respect to an underlying layer on which the spin-on glass composition is to be coated.

14. The method as claimed in claim 11, wherein the spin-on glass composition includes at least one compound including an element selected from the group consisting of boron, fluorine, phosphorous, arsenic, carbon and oxygen as an impurity material.

15. The method as claimed in claim 11, wherein the solvent is xylene or dibutyl ether.

16. The method as claimed in claim 1, wherein a thickness of the silicon oxide layer is from about 4,000 to about 6,500 Å.

17. The method as claimed in claim 1, wherein the stepped portion is formed by at least two conductive patterns.

18. The method as claimed in claim 17, wherein a distance between the conductive patterns is in a range of from about 0.04 about 1 μm.

19. The method as claimed in claim 17, wherein the two conductive patterns are gate electrodes or metal wiring patterns of a semiconductor device.

20. The method as claimed in claim 1, wherein an aspect ratio of the stepped portion is in a range of from about 5:1 to about 10:1.

21. The method as claimed in claim 1, wherein the stepped portion includes a closely stepped portion of which an aspect ratio is from about 5:1 to about 10:1 and a global stepped portion of which an aspect ratio is no more than about 1:1.

22. The method as claimed in claim 1, further comprising forming a silicon nitride layer having a thickness of from about 200 to about 600 Å before coating the spin-on glass composition.

23. A method of forming a silicon oxide layer in a semiconductor manufacturing process, comprising:
   forming a planar SOG layer onto a semiconductor substrate having a stepped portion formed thereon by coating an SOG composition comprising from about 20 to about 30% by weight of perhydropolysilazane having a structure of —(SiH$_2$NH)$_n$— (in which n represents a positive integer), having a weight average molecular weight of from about 4,000 to about 8,000, and having a molecular weight dispersion degree of from about 3.0 to about 4.0, and from about 80 to about 70% by weight of a solvent;
   pre-baking the substrate at a temperature of from about 130 to about 230° C. for about 4 to about 6 minutes;
   maintaining a loading temperature of a furnace into which the substrate will be loaded at about 500° C. or less;

loading the substrate into the furnace and increasing the temperature of the furnace by about 7±3° C./min; and main-baking the substrate at a temperature of from about 500 to about 1200° C. for about 30 to 60 minutes to form a silicon oxide layer on the substrate.

24. The method as claimed in claim 23, further comprising implementing an edge bead removal after forming the SOG layer, and implementing a CMP process after forming the silicon oxide layer.

25. The method as claimed in claim 23, wherein an aspect ratio of the stepped portion is in a range of from about 5:1 to about 10:1.

* * * * *